(12) United States Patent
Kim et al.

(10) Patent No.: US 12,001,250 B2
(45) Date of Patent: Jun. 4, 2024

(54) PORTABLE INFORMATION HANDLING SYSTEM ANTENNA SYSTEM

(71) Applicant: Dell Products L.P., Round Rock, TX (US)

(72) Inventors: Changsoo Kim, Cedar Park, TX (US); Mark Andrew Schwager, Cedar Park, TX (US); Nicholas Gregory DiLoreto, Georgetown, TX (US); Kai-Yuan Cheng, Taipei (TW)

(73) Assignee: Dell Products L.P., Round Rock, TX (US)

( * ) Notice: Subject to any disclaimer, the term of this patent is extended or adjusted under 35 U.S.C. 154(b) by 142 days.

(21) Appl. No.: 17/874,393

(22) Filed: Jul. 27, 2022

(65) Prior Publication Data

US 2024/0036621 A1  Feb. 1, 2024

(51) Int. Cl.
| | |
|---|---|
| *G06F 1/16* | (2006.01) |
| *G06F 1/20* | (2006.01) |
| *H01Q 1/02* | (2006.01) |
| *H01Q 1/22* | (2006.01) |
| *H01Q 1/36* | (2006.01) |
| *H01Q 1/42* | (2006.01) |
| *H01Q 13/10* | (2006.01) |
| *H05K 7/20* | (2006.01) |

(52) U.S. Cl.
CPC ............ *G06F 1/1698* (2013.01); *G06F 1/203* (2013.01); *H01Q 1/02* (2013.01); *H01Q 1/2266* (2013.01); *H01Q 1/36* (2013.01); *H01Q 1/42* (2013.01); *H01Q 13/10* (2013.01); *H05K 7/20409* (2013.01)

(58) Field of Classification Search
CPC ......... G06F 1/1698; G06F 1/203; H01Q 1/02; H01Q 1/2266; H01Q 1/36; H01Q 1/42; H01Q 13/10; H05K 7/20409
See application file for complete search history.

(56) References Cited

U.S. PATENT DOCUMENTS

| 11,031,674 B1 * | 6/2021 | Ramasamy | .......... H01Q 1/2266 |
| 2020/0127384 A1 * | 4/2020 | Thakur | ................ H01Q 1/2266 |

* cited by examiner

*Primary Examiner* — Seung H Lee
(74) *Attorney, Agent, or Firm* — Terrile, Cannatti & Chambers, LLP; Stephen A. Terrile

(57) ABSTRACT

An antenna system for a portable information handling system. The antenna system includes an antenna radiating element and an antenna carrier assembly, the antenna radiating element being mounted to the antenna carrier assembly, the antenna carrier assembly comprising a first radiating slot and a second radiating slot, the first radiating slot providing a radiation path through a C-Cover of a base chassis of the portable information handling system in a lid open state of operation, the second radiating slot providing a radiation path through a D-cover of a base chassis of the portable information handling system in a lid closed state of operation.

10 Claims, 22 Drawing Sheets

PORTABLE INFORMATION HANDLING SYSTEM ANTENNA SYSTEM

BACKGROUND OF THE INVENTION

Field of the Invention

The present invention relates to information handling systems. More specifically, embodiments of the invention relate to an antenna system for a portable information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

In one embodiment the invention relates to an antenna system for a portable information handling system, comprising: an antenna radiating element; and, an antenna carrier assembly, the antenna radiating element being mounted to the antenna carrier assembly, the antenna carrier assembly comprising a first radiating slot and a second radiating slot, the first radiating slot providing a radiation path through a C-Cover of a base chassis of the portable information handling system in a lid open state of operation, the second radiating slot providing a radiation path through a D-cover of a base chassis of the portable information handling system in a lid closed state of operation.

In another embodiment the invention relates to an information handling system comprising: a processor; a data bus coupled to the processor; and an information handling system chassis housing, the chassis housing comprising a base chassis, the base chassis comprising an antenna system, the antenna system comprising an antenna radiating element; and, an antenna carrier assembly, the antenna radiating element being mounted to the antenna carrier assembly, the antenna carrier assembly comprising a first radiating slot and a second radiating slot, the first radiating slot providing a radiation path through a C-Cover of the base chassis of the portable information handling system in a lid open state of operation, the second radiating slot providing a radiation path through a D-cover of the base chassis of the portable information handling system in a lid closed state of operation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
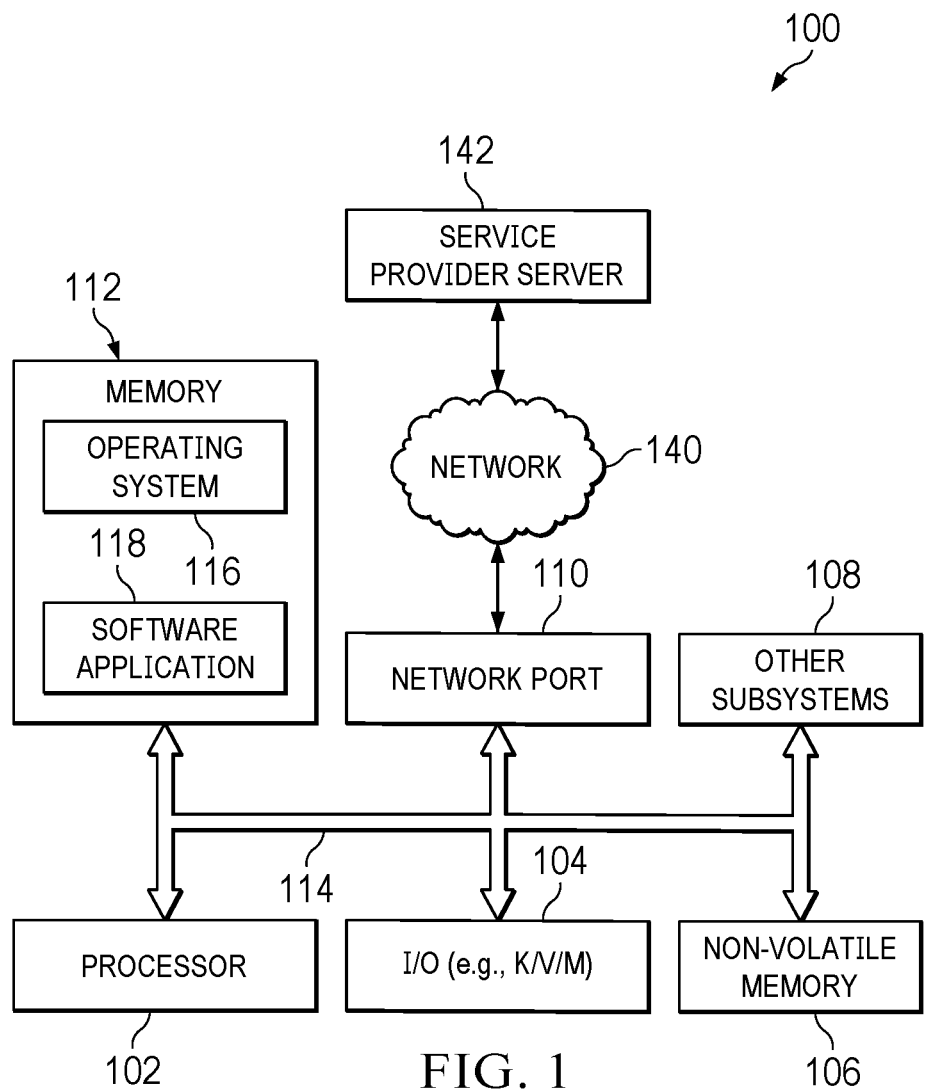
FIG. 1 shows a general illustration of components of an information handling system as implemented in the system and method of the present invention.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Various aspects of the present disclosure include an appreciation that portable information handling system antenna design is often challenged in premium devices pursuing a full metal chassis without any metal breaks or slots for antennas. With many known portable information handling system, antenna windows or slots are very easily noticeable from outside. In some instances, the industrial design of the portable information handling system is compromised further because additional processes are used to cover the window or open hole (slot) such as with mylar, mesh or painting process.

Additionally, various aspects of the present disclosure include an appreciation that often the rear side of a portable information handling system between hinges is a desirable place in a base chassis to place the antenna because of less impact by human hand interference. Additionally, various aspects of the present disclosure include an appreciation that often for drop hinge clamshell notebooks, the rear is often reserved for thermal heat exhaust and that the thermal structure can often prevent proper antenna keep out (i.e., the area where no metal or antenna impact materials (such as graphite) are allowed) and ground structure causing poor antenna performance.

Accordingly, various aspects of the present disclosure include an appreciation that an antenna solution requires collaboration between the antenna team, thermal team, industrial design team and mechanical team to develop an antenna solution that doesn't compromise the thermal performance or industrial design requirements of the portable information handling system.

Accordingly, an antenna solution is disclosed which is positioned along the rear of a base chassis assembly, sandwiched between the c-cover and d-cover, and radiating out the back side of the base chassis assembly. In certain embodiments, the antenna solution includes an antenna carrier assembly which includes laser direct structuring (LDS). In certain embodiments, the top, left, right, bottom and rear of the envelope of the antenna carrier assembly are covered with LDS to provide a continuous ground plane to isolate and shield noise between the antenna and the motherboard of the portable information handling system. In certain embodiments, the antenna carrier assembly includes a three-sided gasket between the c-cover and the antenna and the d-cover and the antenna to complete the isolation shielding along a rear edge of the portable information handling system. In certain embodiments, the antenna assembly is positioned behind a remote heat exchanger (RHE) fin stack of the portable information handling system.

In certain embodiments, the antenna is assembled to the c-cover, to allow easier assembly of the antenna wires/connectors routed and connected to the motherboard (MB), prior to the d-cover to be assembled. In certain embodiments, the antenna radiating element is positioned on the outside of the antenna envelope so as to be located farthest away from C- and D-cover metal to maximize performance. In certain embodiments, the antenna cables are routed on the inside of the antenna envelope. The LDS structure of the antenna carrier assembly from the wire to the radiating element passes through a hole in the antenna carrier assembly, so technically the antenna is radiating on the outside surface to maximize performance, extending outside the metal enclosure. In certain embodiments, the exhaust shape opening of the envelope of the thermal structure is designed around the frequency of the radiation to allow air to pass through the antenna carrier assembly, but without concern of noise. In certain embodiments, the exhaust shape opening is substantially (e.g., +/−0.10 mm) 5.5 mm in the X direction.

In certain embodiments, the antenna solution includes a slot located under the d-cover foot to allow additional performance in a closed mode of operation, since the metal A-cover (in the closed mode) completely blocks the radiation from the top side. In certain embodiments, the hidden D-cover slot enables a dual mode radiating structure between lid open and lid closed status (also referred to a dual slot). With this structure, RF energy radiates through C cover open window when the system is in an lid open state and RF energy radiates through D cover slot in when the system is in a lid close state. In certain embodiments, the hidden antenna slot on D cover for dual mode radiating structure is configured as a substantially (e.g., +/−20%) half wavelength slot. In certain embodiments, the hidden antenna slot is positioned in the d-cover underneath the foot.

In certain embodiments, the mesh wall of the antenna carrier assembly provides noise isolation. In certain embodiments, the mesh wall of the antenna carrier assembly is generated via an LDS pattern. In certain embodiments, the wall of the antenna carrier assembly provides RF shielding. In certain embodiments, openings in the mesh wall are designed to be substantially Lambda over eight of the high frequency.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise at least one software application 118. In one embodiment, the information handling system 100 is able to download the software application from the service provider server 142. In another embodiment, the software application 118 is provided as a service from the service provider server 142.

Figure 2:
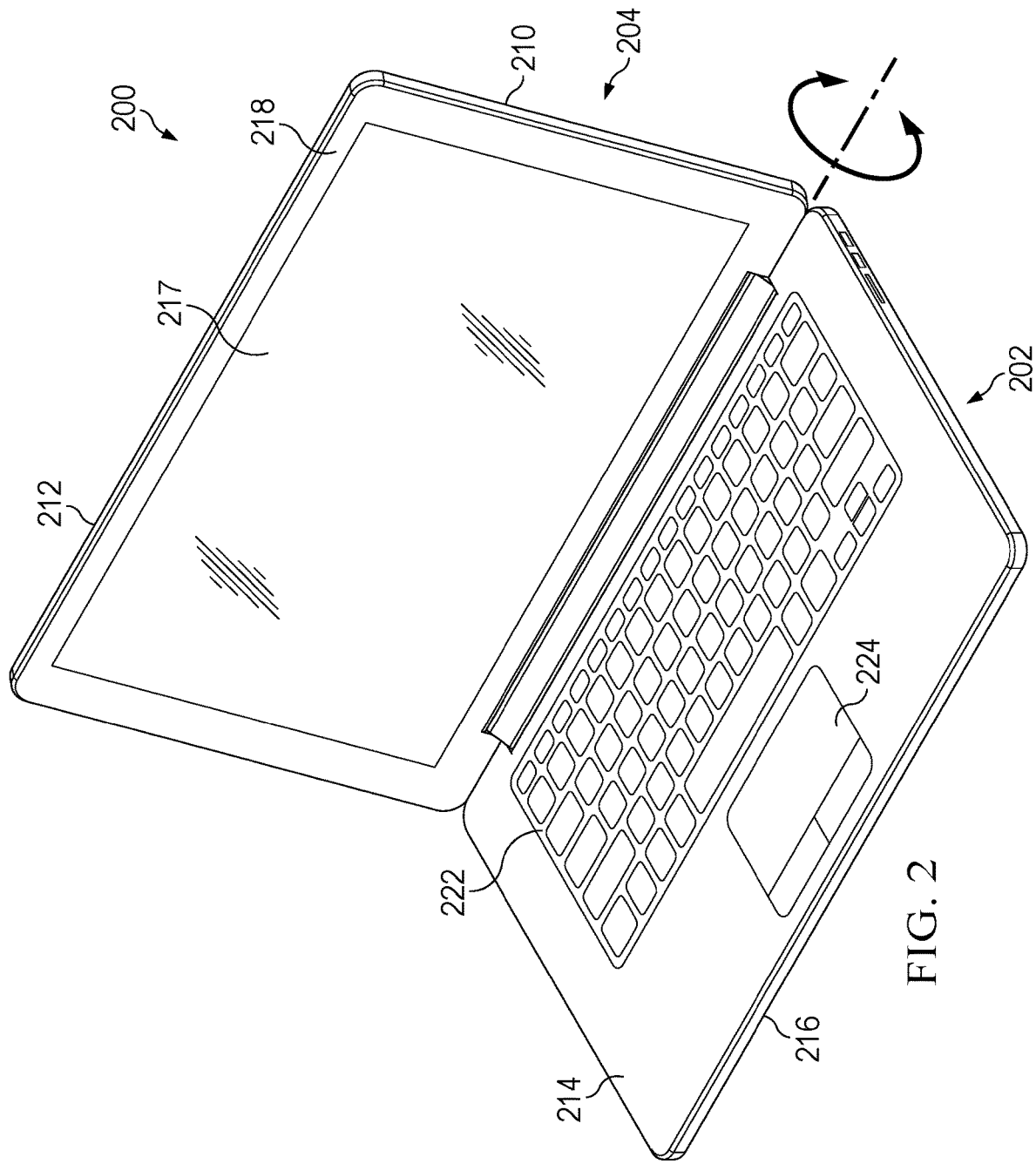
FIG. 2 shows a perspective view of an example portable information handling system.

FIG. 2 shows a perspective view of an example portable information handling system chassis 200 such as a tablet type portable information handling system, a laptop type portable information handling system, or any other mobile information handling system. It will be appreciated that some or all of the components of the information handling system 100 may be included within information handling system chassis 200. The portable information handling system 200 chassis includes a base chassis 202 and a display chassis 204 shown in an open configuration. It will be appreciated that a closed configuration would have the display chassis 204 fully closed onto the base chassis 202.

The base chassis 202 or the display chassis 204 of the information handling system 200 may comprise an outer metal case or shell. The information handling system 200 may include a plurality of chassis portions. In various embodiments, the information handling system 200 may include some or all of an A-Cover 210, a B-Cover 212, a C-cover 214 and a D-Cover 216. In various embodiments, the A-Cover 210 and the B-Cover 212 provide the display chassis 204. In various embodiments, the C-Cover 214 and the D-Cover 216 provide the base chassis 202.

In various embodiments, the A-cover 210 encloses a portion of the display chassis 204 of the information handling system 200. In various embodiments, the B-cover 212 encloses another portion of the display chassis 204 of the information handling system 200. In various embodiments, the B-Cover may include a display screen 217 and a bezel 218 around the display screen.

In various embodiments, the C-cover 214 encloses a portion of the base chassis 202 of the information handling system 200. In various embodiments, the C-cover 214 may include, for example, a keyboard 222, a trackpad 224, or other input/output (I/O) device. In various embodiments, certain components of the information handling system such as a mother board are mounted within the C-Cover 214. In various embodiments, the D-cover 216 encloses another portion of the base chassis 202 of the information handling system 200.

When placed in the closed configuration, the A-cover 210 forms a top outer protective shell, or a portion of a lid, for the information handling system 200, while the D-cover 216 forms a bottom outer protective shell, or a portion of a base, for the information handling system. When in the fully closed configuration, the A-cover 210 and the D-cover 216 would be substantially parallel to one another.

In some embodiments, both the A-cover 210 and the D-cover 216 may be comprised entirely of metal. In some embodiments, the A-cover 210 and D-cover 216 may include both metallic and plastic components. For example, plastic components that are radio-frequency (RF) transparent may be used to form a portion of the C-cover 214.

In various embodiments, the display chassis 204 may be movably connected to a back edge of the base chassis 202 via one or more hinges. In this configuration, the hinges allow the display chassis 204 to rotate from and to the base chassis 202 allowing for multiple orientations of the information handling system 200. In some embodiments, the information handling system may be a laptop with limited rotation of the display chassis 2040 with regard to the base chassis 202, for example up to 140° rotation arc (+/−25%). In other embodiments the information handling system 200 may be a convertible information handling system with full rotation to a tablet configuration.

Figure 3:
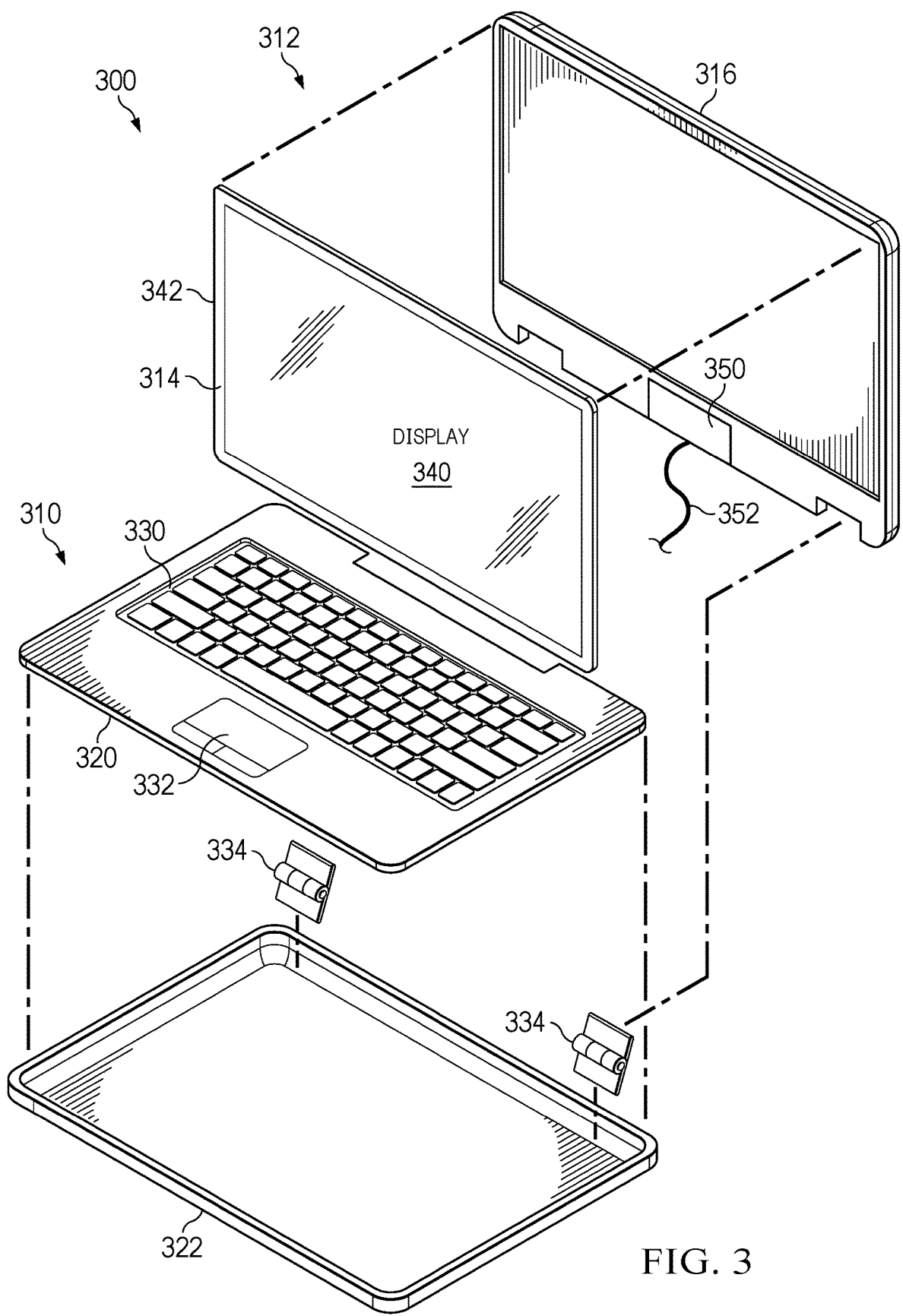
FIG. 3 shows a blown-up view of a portable information handling system.

FIG. 3 shows a blown-up view of a portable information handling system 300 having rotationally-coupled housing portions. In the example embodiment, a main housing portion 310 (which corresponds to a base chassis 202) rotationally couples to a lid housing portion 312 (which corresponds to a display chassis 204) to support various configurations to interact with an end user. Main housing portion 310 may hold one or more components of the portable information handling system, including but not limited to processor 102, system bus 114, memory subsystem 112, I/O subsystem 104 and network interface 110 discussed with respect to FIG. 1. Main housing portion 310 includes a top cover portion 320 (which includes the C-Cover 214) and a bottom cover portion 322 (which includes the D-Cover 216). Lid housing portion 312 includes a display cover portion 314 (which includes the B-Cover 210) and a rear display cover portion 316 (which includes the A-Cover 212). The top cover portion 320 may include an integrated keyboard 330 or other I/O devices, such as a trackpad 332 or microphone (not shown). In various embodiments, the keyboard 330 may be mounted to the top of the C-Cover of the main housing portion 310. In various embodiments, the keyboard 330 may be mounted to the underside of the C-Cover of the main housing portion 310.

Lid housing portion 312 is rotationally coupled to main housing portion 310 via at least one hinge assembly 334. Lid housing portion 312 includes display 340 that visually presents information to the user as well as a bezel 342. Display 340 may be a touch panel with circuitry enabling touch functionality in conjunction with a display. In some embodiments, display 340 may be an "infinity edge" or "narrow bezel" display that approaches one or more the edges of lid housing portion 212 such that bezel may be narrow in size (e. g., less than 10 millimeters) on the edges. For example, display 340 is an infinity display with narrow bezels on the top and sides of lid housing portion 212 in the embodiment shown in FIG. 3. In certain embodiments, the side bezel is less than 4 mm (+/−10%) and the top bezel is less than 6 mm (+/−10%).

Lid housing portion 312 may also include timing controller (TCON) 350. Hinge assembly 330 may include cable 352 for communicably coupling one or more components within main housing portion 310 to one or more components within lid housing portion 312. For example, cable 352 may provide communication of graphics information from an I/O subsystem to TCON 350 for generation of visual images for display on display 340. Although a single cable 352 is shown, portable information handling system 300 may include one or more additional cables 352 for communicating components disposed in main housing portion 310 and lid housing portion 312. Placement of cable 352 may be selected based on design considerations, materials or manufacturing cost, material reliability, antenna placement, as well as any other considerations.

Hinge assembly 334 allows main housing portion 310 and lid housing portion 312 to rotate between a plurality of positions. For example, when portable information handling system 300 is not in use, lid housing portion 312 may be closed over the top of main portion 310 such that display 340 and keyboard 330 are protected from unintended use or damage. Rotation of lid housing portion 312 by approximately 90 degrees from main housing portion 310 brings display 340 in a raised "clamshell" position relative to keyboard 330 so that an end user can make inputs to keyboard 330 or touch panel portion of display 340 while viewing display 340. In some embodiments, clamshell position may represent lid housing portion 312 open between approximately 1 and 180 degrees from main housing portion 310. Rotation of lid housing portion 312 between approximately 180 and 359 degrees from main housing portion 310 may place portable information handling system 300 in "tablet stand" and/or "tent" positions. In tablet stand and tent positions, the user may make inputs via touch panel portion of display 340 while viewing display 340. A full 360 degree rotation of main housing portion 310 relative to lid housing portion 312 provides a tablet configuration having display 340 exposed to accept touch inputs. In any position, user inputs may be communicated to an I/O subsystem or a processor of the portable information handling system 300 for processing, and then updated information may be communicated back via cable 352 to display 340 for displaying to the user. Hinge assembly 334 may be comprised of one or more discrete hinges or a unified assembly of hinges.

Figure 4A:
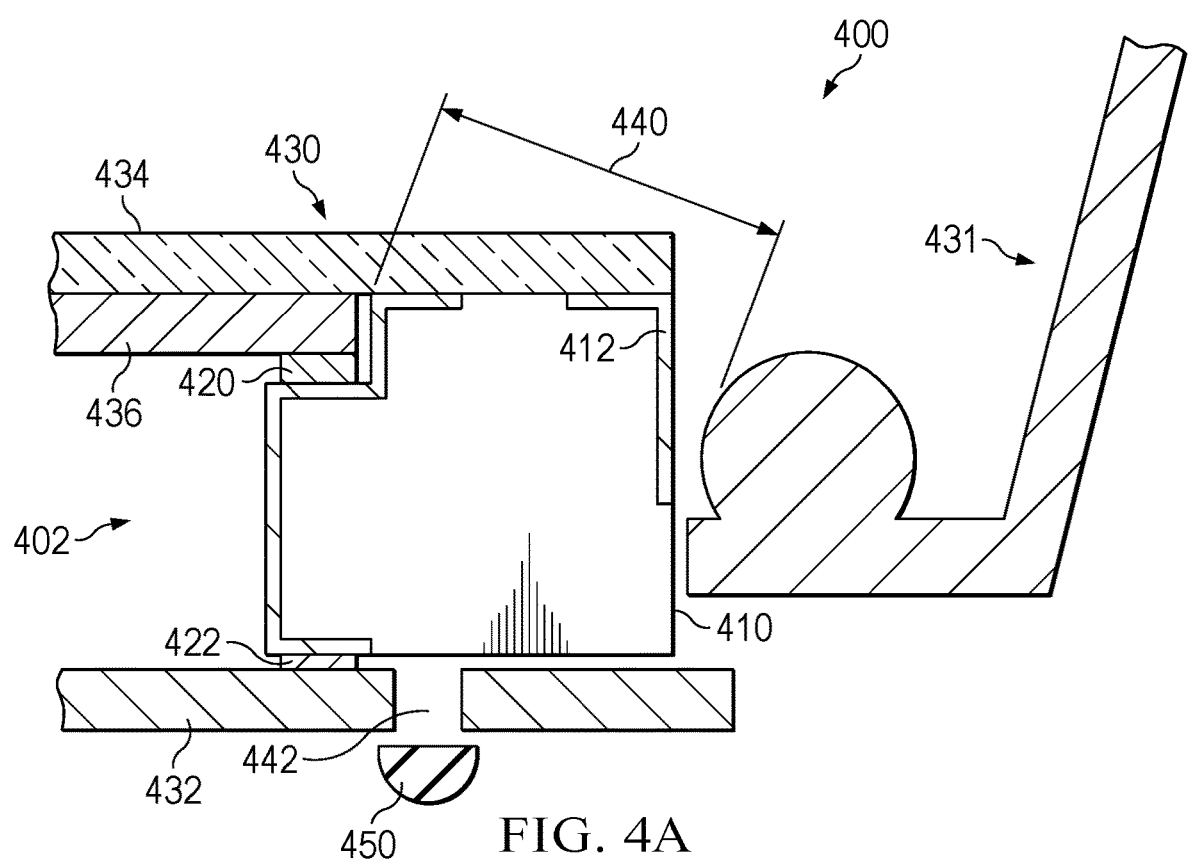
FIGS. 4A and 4B show side views of a dual radiating antenna system in a portable information handling system.
Figure 4B:
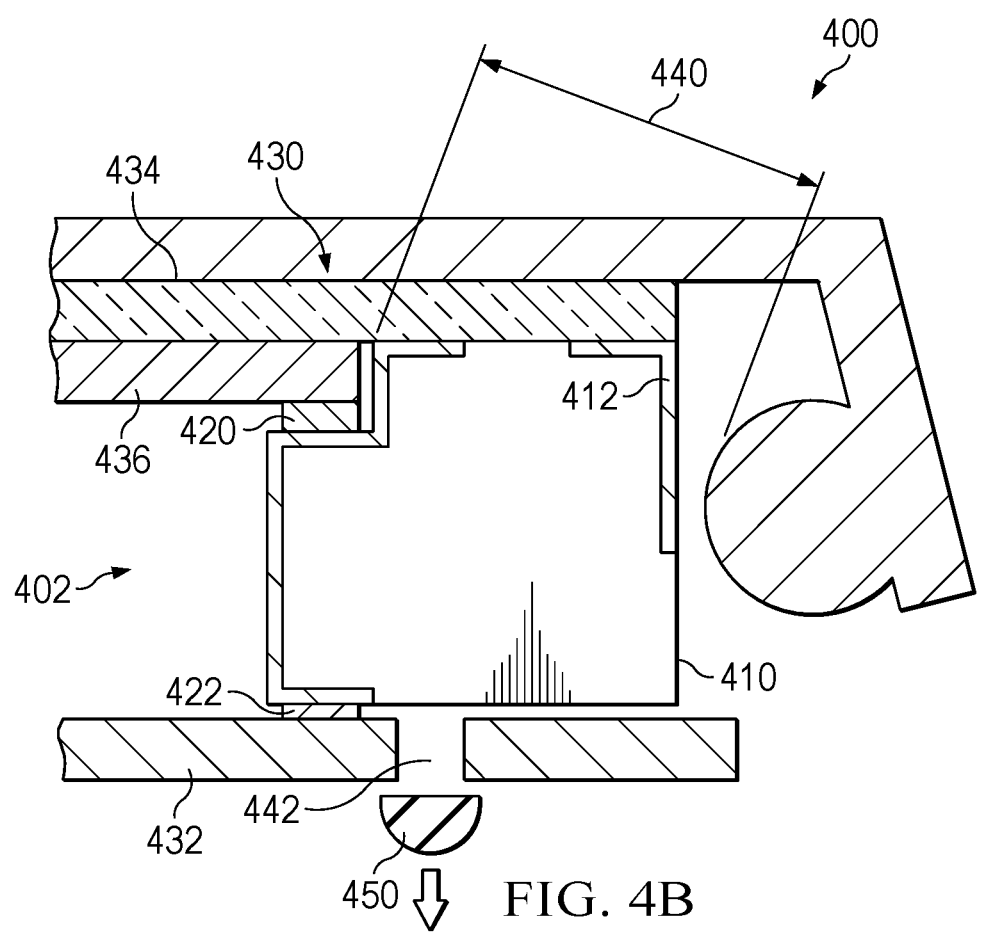
Figure 5A:
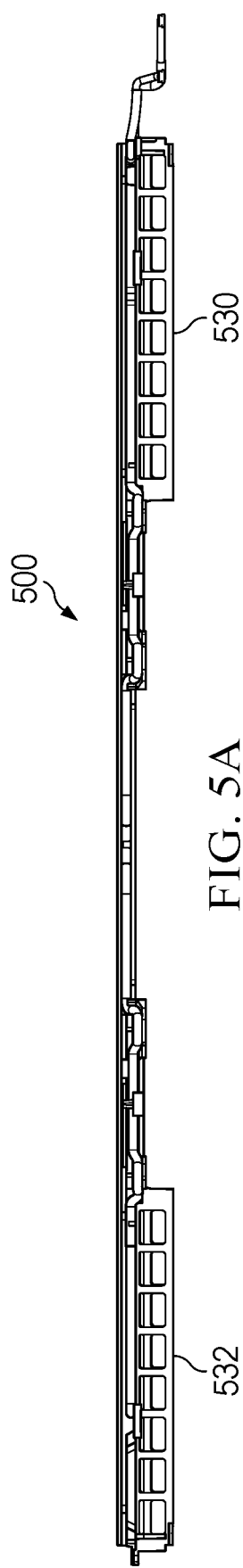
FIGS. 5A, 5B, 5C and 5D respectively, show front, rear, bottom and top views of an antenna carrier.
Figure 5B:
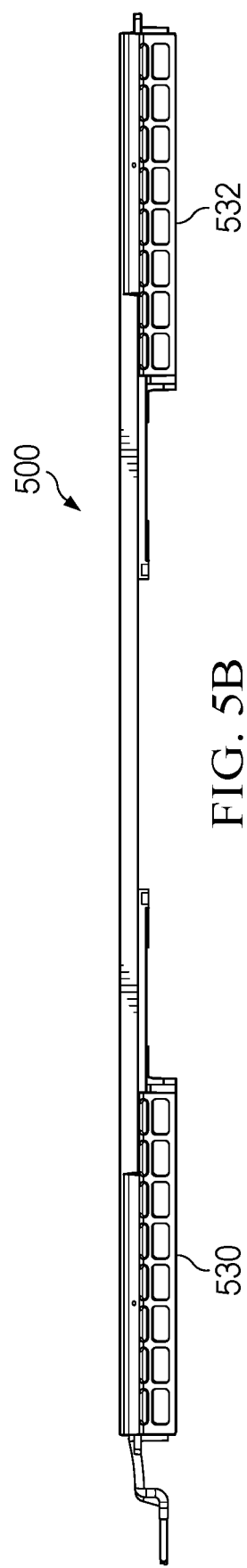
Figure 5C:
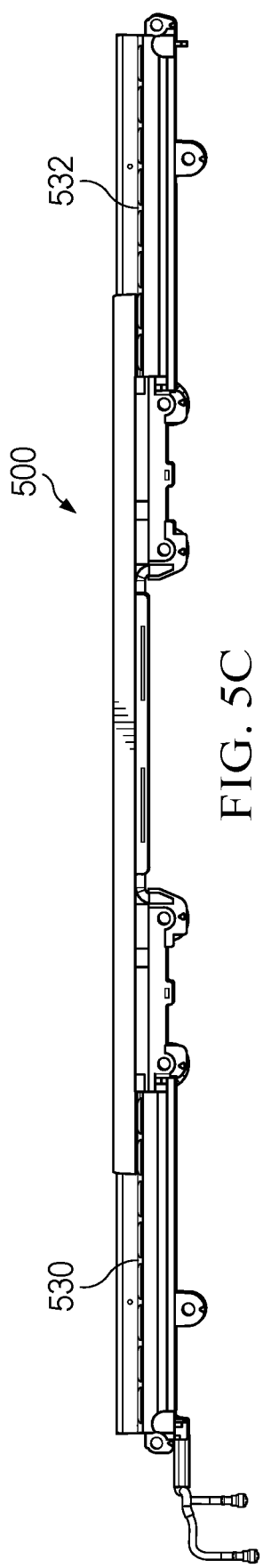
Figure 5D:
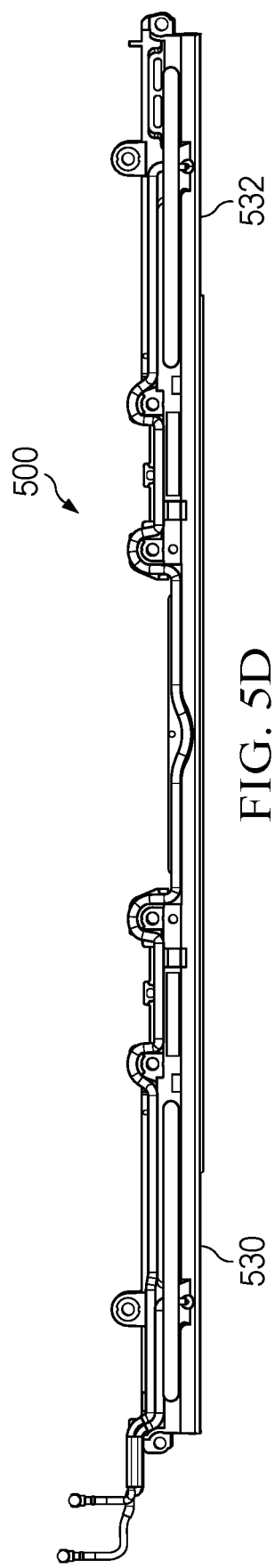

FIGS. 4A and 4B show side views of a dual radiating antenna system 400 in base chassis 402 of a portable information handling system. In certain embodiments, the dual radiating antenna system 400 includes an antenna carrier assembly 410 and an antenna 412. In certain embodiments, conductive gaskets 420, 422 electrically couple the antenna carrier assembly 412 to a C-cover 430 and D-cover 432 of a base chassis of the portable information handling system. In certain embodiments, the C-Cover 430 includes a glass portion 434 and a metal portion 436. In certain embodiments, radiating slots 440, 442 may be considered as included within the dual radiating antenna system 400. In certain embodiments, the gap between the C-cover 430 and the A-Cover 431 defines the radiating slot 440 and the D-cover 432 defines the radiating slot 442. In certain embodiments, by providing the glass portion 434, the radiating slot 440 is hidden such that there is no visible antenna window when the information handling system is in an open configuration.

In certain embodiments, the antenna system 400 is positioned along the rear of the base chassis assembly 402, sandwiched between the c-cover 430 and d-cover. In certain embodiments, the antenna system radiates out the back side of the base chassis assembly.

In certain embodiments, the antenna system 400 includes a slot 442 located under the D-cover foot 450 to allow additional performance in a closed mode of operation, since the metal A-cover (in the closed mode) completely blocks the radiation from the top side. In certain embodiments, the hidden D-cover slot 442 enables a dual mode radiating structure between lid open and lid closed status (also referred to a dual slot). With this structure, RF energy radiates through C cover open window when the system is in a lid open state and RF energy radiates through D cover slot in when the system is in a lid close state. In certain embodiments, the hidden antenna slot on D cover for dual mode radiating structure is configured as a substantially (e.g., +/−20%) half wavelength slot. In certain embodiments, the hidden antenna slot is positioned in the D-cover underneath the foot.

Figure 6:
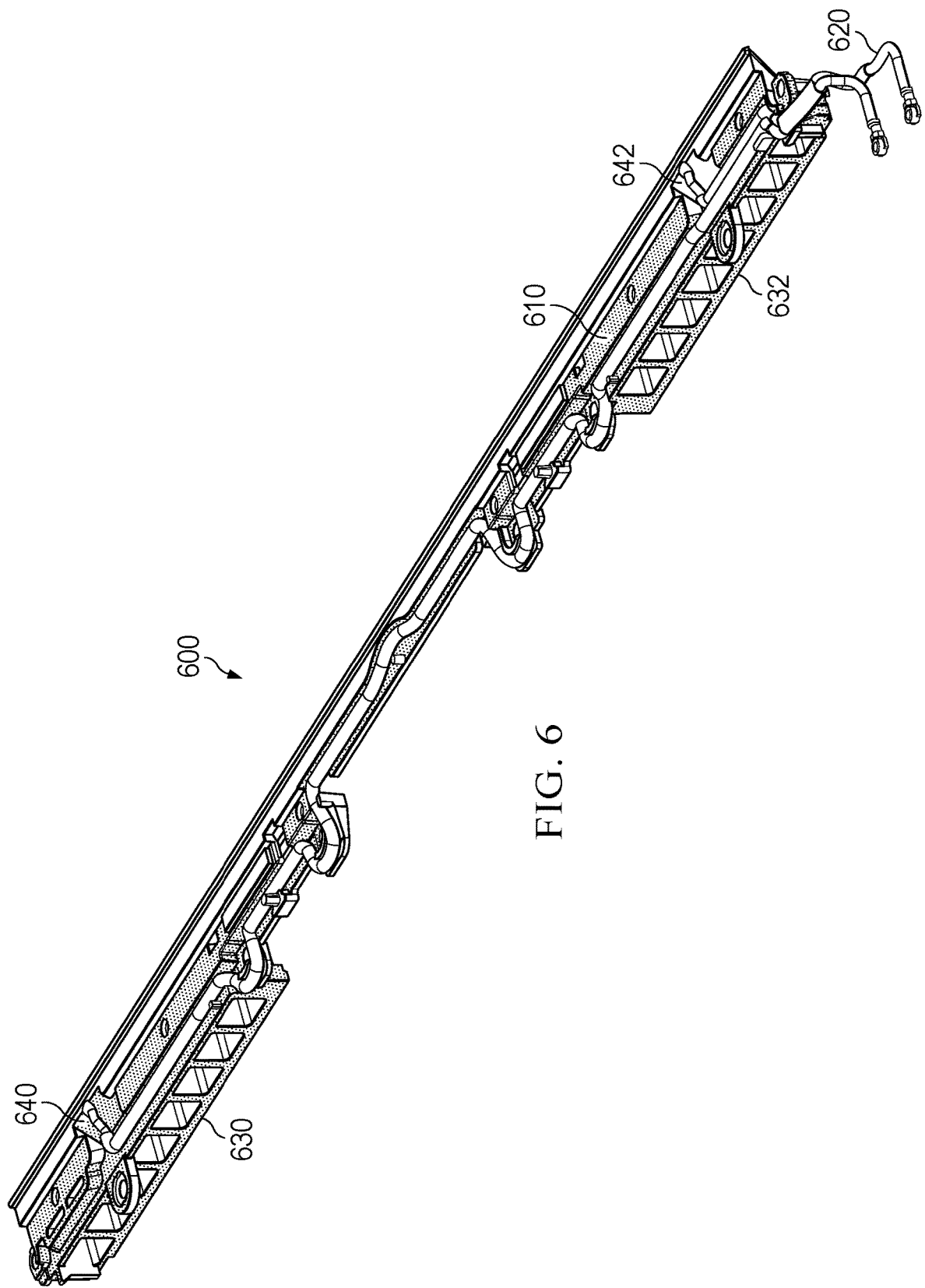
FIG. 6 shows perspective view of an antenna carrier assembly.

FIGS. 5A, 5B, 5C and 5D respectively, show front, rear, bottom and top views of an antenna carrier 500. FIG. 6 shows perspective view of an antenna carrier assembly 600 (also referred to as an antenna system).

In certain embodiments, the antenna carrier 500 includes laser direct structuring (LDS). In certain embodiments, the top, left, right, bottom and rear of the envelope of the antenna carrier assembly are covered with LDS to provide a continuous ground plane 610 to isolate and shield noise between the antenna and the motherboard of the portable information handling system. In certain embodiments, the antenna carrier 600 includes a three-sided gasket between the D-cover and the antenna and the C-cover and the antenna to complete the isolation shielding along a rear edge of the portable information handling system.

In certain embodiments, the antenna assembly is assembled to the C-cover, to allow easier assembly of the antenna wires/connectors routed and connected to the motherboard (MB), prior to the D-cover to be assembled. In certain embodiments, the antenna carrier 500 includes air flow portions 530, 532.

In certain embodiments, the antenna assembly 600 includes a plurality of antenna radiating elements (not shown). In certain embodiments, the antenna radiating elements are positioned on the outside of the antenna system envelope so as to be located farthest away from C- and D-cover metal to maximize performance. In certain embodiments, the antenna cables 620 are routed on the inside of the antenna envelope. In certain embodiments, each antenna cable 620 includes a ground portion and a signal transmission portion. In certain embodiments, the ground portions are coupled to the ground plane 610 of the antenna assembly and the signal transmission portions are coupled to respective radiating elements.

In certain embodiments, the antenna carrier 600 includes air flow portions 630, 632. The LDS structure of the antenna carrier assembly from the wire to the radiating elements pass through respective holes 640, 642 in the antenna carrier assembly, so technically the antenna is radiating on the outside surface to maximize performance, extending outside the metal enclosure. In certain embodiments, the exhaust shape openings of the air flow portions 630, 632 of the envelope of the thermal structure are designed around the frequency of the radiation to allow air to pass through the antenna carrier assembly, but without concern of noise.

Figure 7:
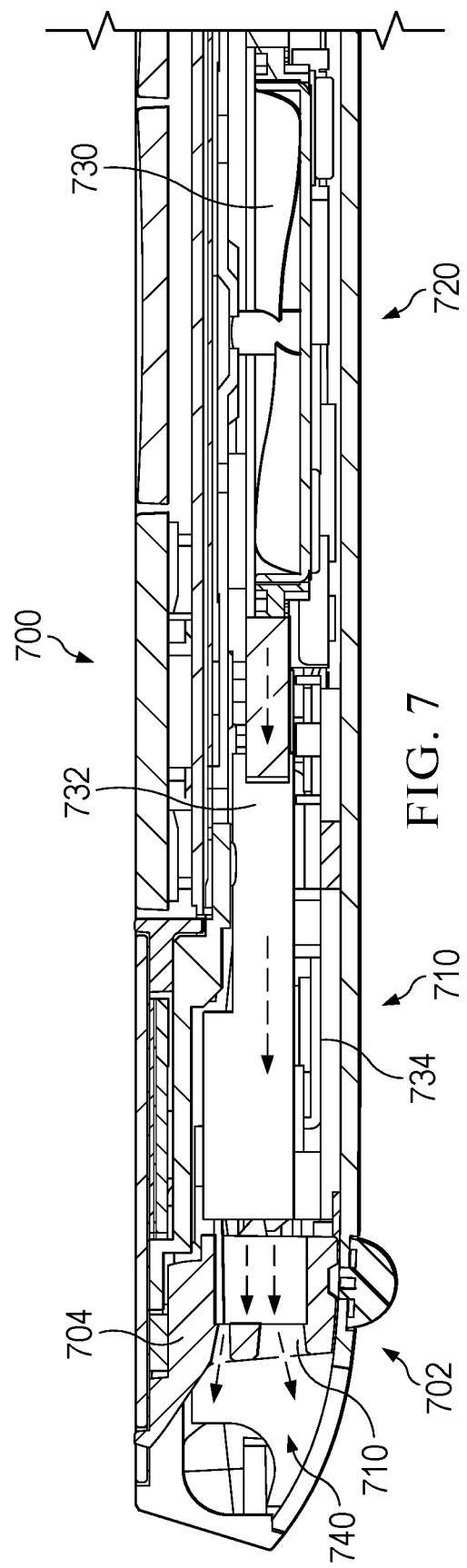
FIG. 7 shows a cut away side view of a portion of a portable information handling system.
Figure 8:
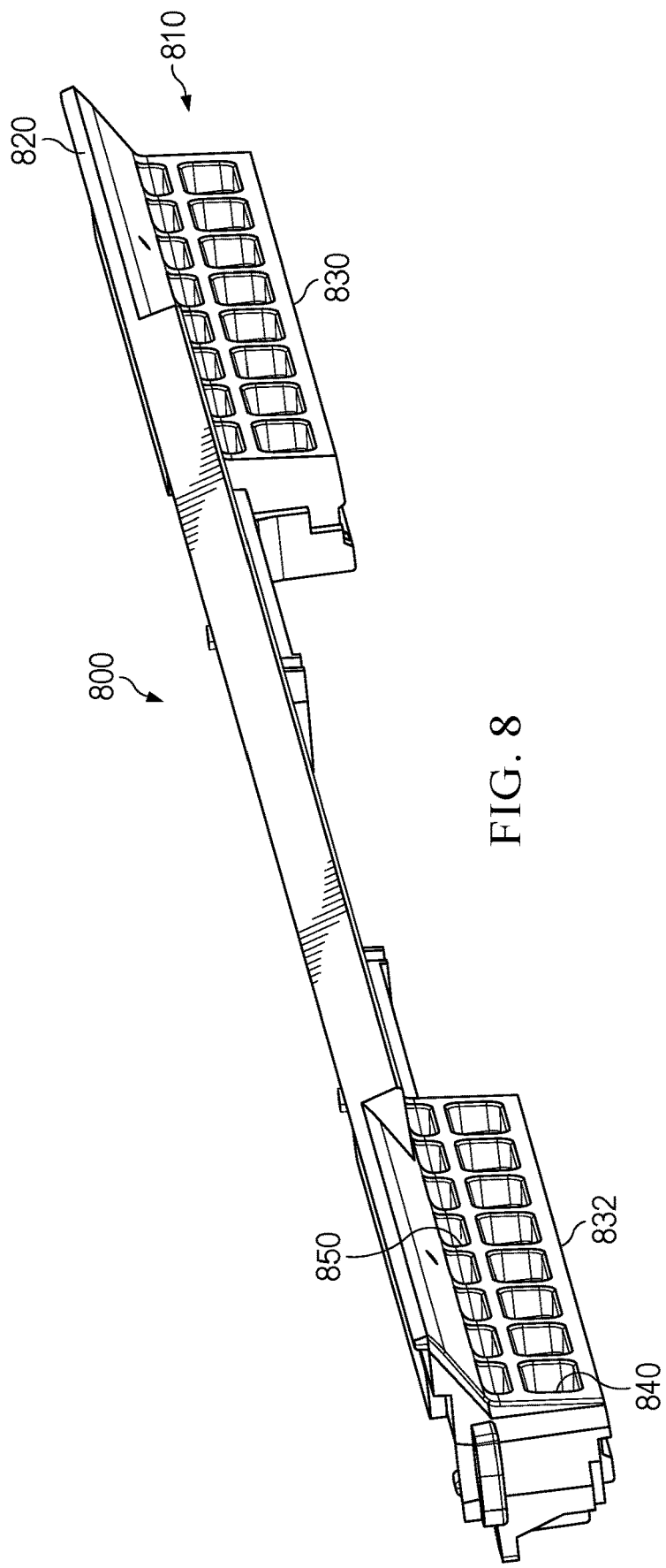
FIG. 8 shows a perspective view of rear air flow component of a portable information handling system.

FIG. 7 shows a cut away side view of a portion of a portable information handling system. FIG. 8 shows a perspective view of rear air flow component 800 of a portable information handling system.

In certain embodiments, the antenna system 702 includes a heat exhaust structure 710 which functions in combination with a thermal assembly 720. In certain embodiments, the thermal assembly 720 includes a fan 730, a remote heat exchanger fin stack 732 and a remote heat exchanger heat pipe 734. In certain embodiments, the antenna assembly is positioned behind the remote heat exchanger fin stack 732. In certain embodiments, air flows from the fan 730 across the remote heat exchanger fin stack 732, through the antenna system 702 and out the rear 740 of the portable information handling system.

In certain embodiments, the antenna system 702 includes a rear air flow component 800. In certain embodiments, the rear air flow component functions cooperatively with the thermal assembly 720 to allow air flow out the rear 740 of the portable information handling system. In certain embodiments, the rear air flow component 800 includes a mesh portion 810 and an angled portion 820. In certain embodiments, the mesh portion 810 includes a plurality of mesh portions 830, 832. In certain embodiments, the mesh portion 810 allows air flow mounting for respective antenna radiating elements. In certain embodiments, the dimensions of the apertures 840 of the mesh portion 810 are optimized to facilitate air flow as well as RF radiation transmission. In certain embodiments, the mesh portion 810 includes another set of apertures 850. In certain embodiments, each aperture 850 is vertically aligned with a respective aperture 840.

In certain embodiments, the rear air flow component 800, and particularly the mesh portion 810, of the antenna system 702 provides noise isolation. In certain embodiments, the mesh portion 810 of the antenna system 702 is generated via an LDS pattern. In certain embodiments, the mesh portion 810 of the antenna system 702 provides thermal and RF shielding. In certain embodiments, openings (e.g., 840) in the mesh wall are designed to be substantially Lambda over eight of the high frequency In certain embodiments, some or all of the exhaust shape openings 840 in the mesh wall are designed to be substantially Lambda over eight of the high frequency of the antenna system 702. In certain embodiments, some or all of the exhaust shape openings 840 are substantially (e.g., +/−20%) 5.5 mm in the X direction. In certain embodiments, some or all of the exhaust shape openings 840 of the mesh portion 810 are substantially (e.g., +/−20%) 4.25 mm in the Y direction. In certain embodiments, the exhaust shape openings of another set of apertures 850 are smaller in the Y direction than the dimensions of the exhaust shape openings 840 of the mesh portion 810.

Figure 9A:
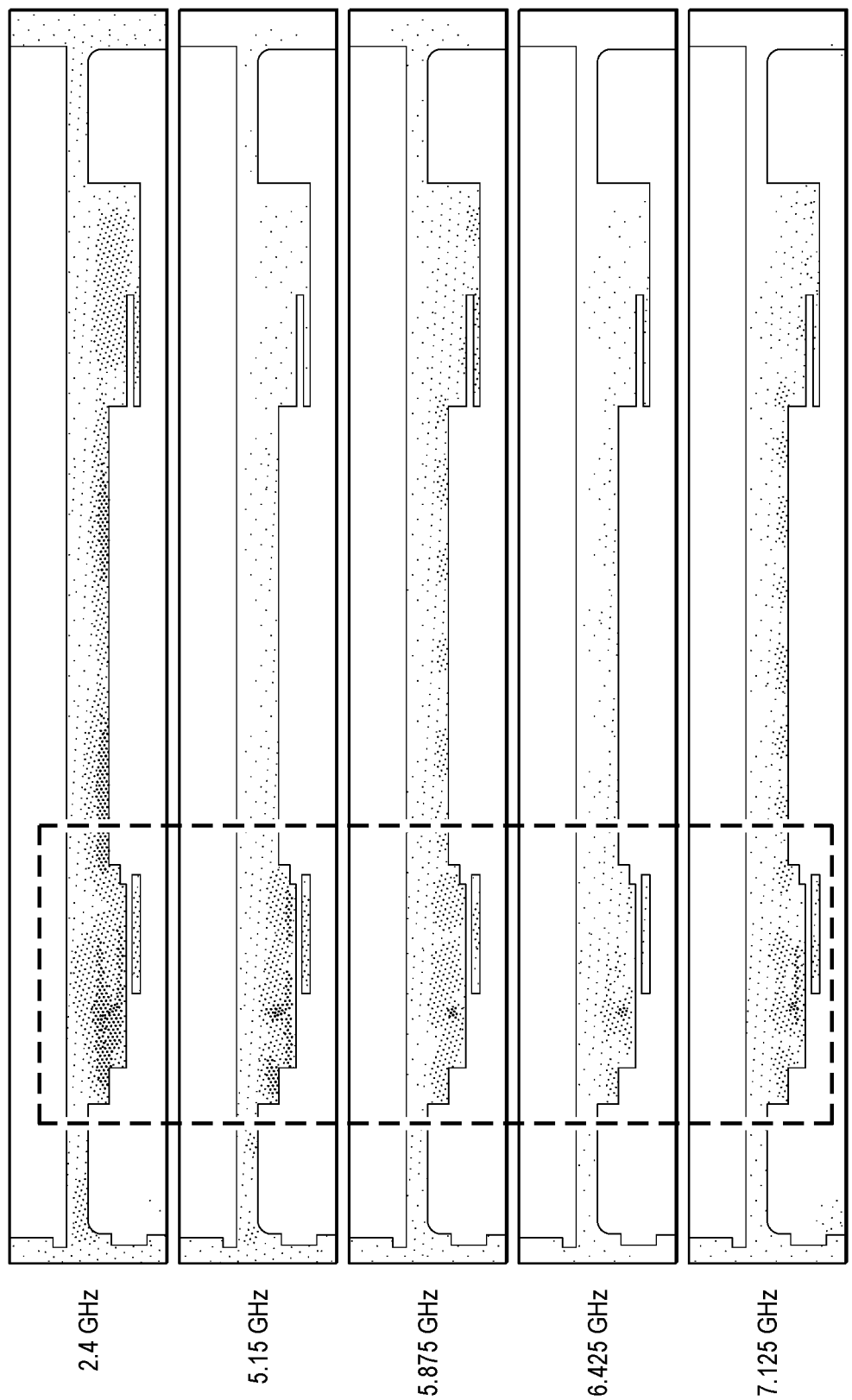
FIGS. 9A and 9B show example E field distributions for a portable information handling system.
Figure 9B:
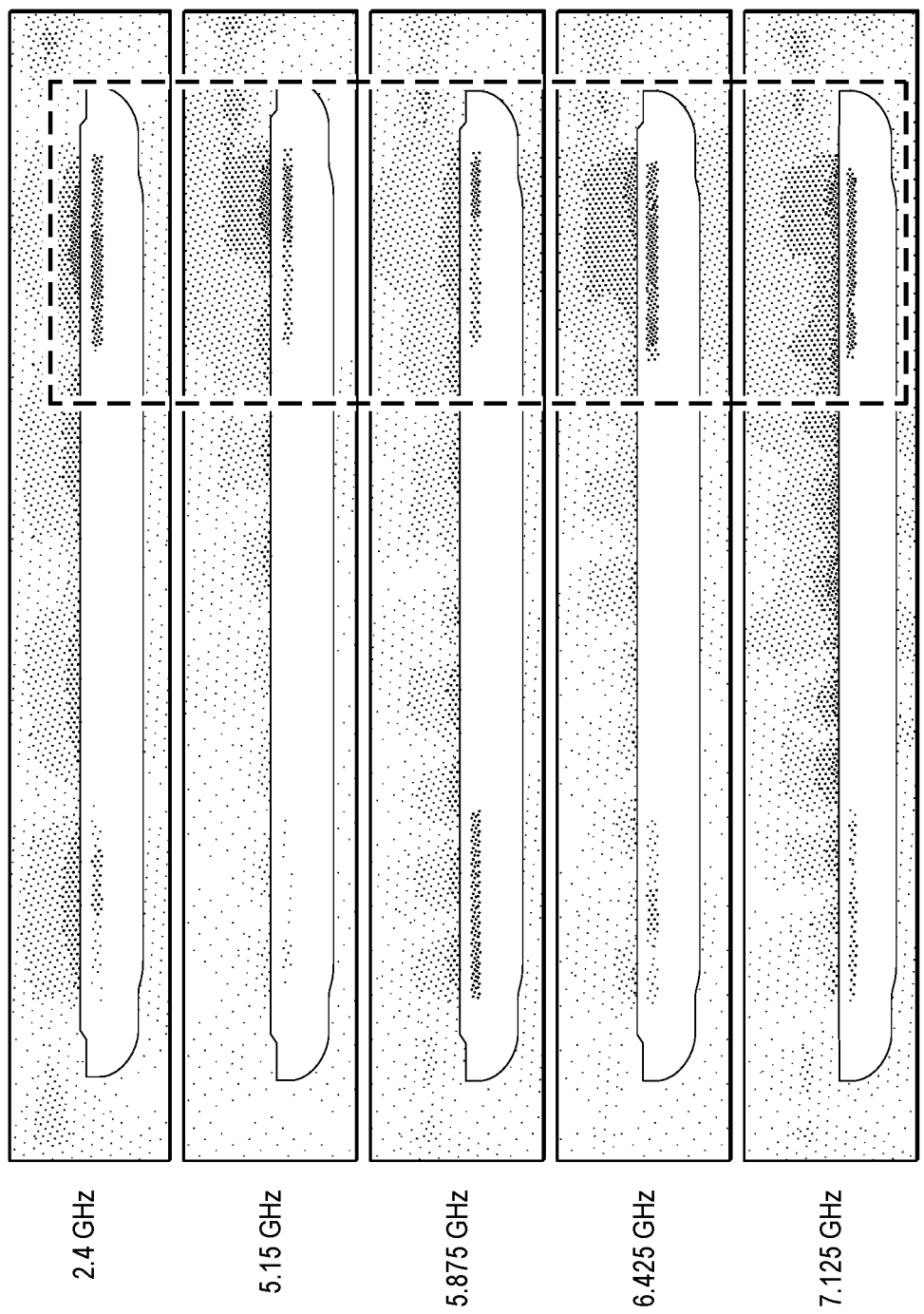

FIGS. 9A and 9B show example E field distributions for a portable information handling system. More specifically, FIG. 9A shows example E field distributions across a plurality of example frequencies through the C-cover window when the display chassis is open. FIG. 9B shows example E field distributions across a plurality of example frequencies through the D-cover slot when the display chassis is open.

Figure 10A:
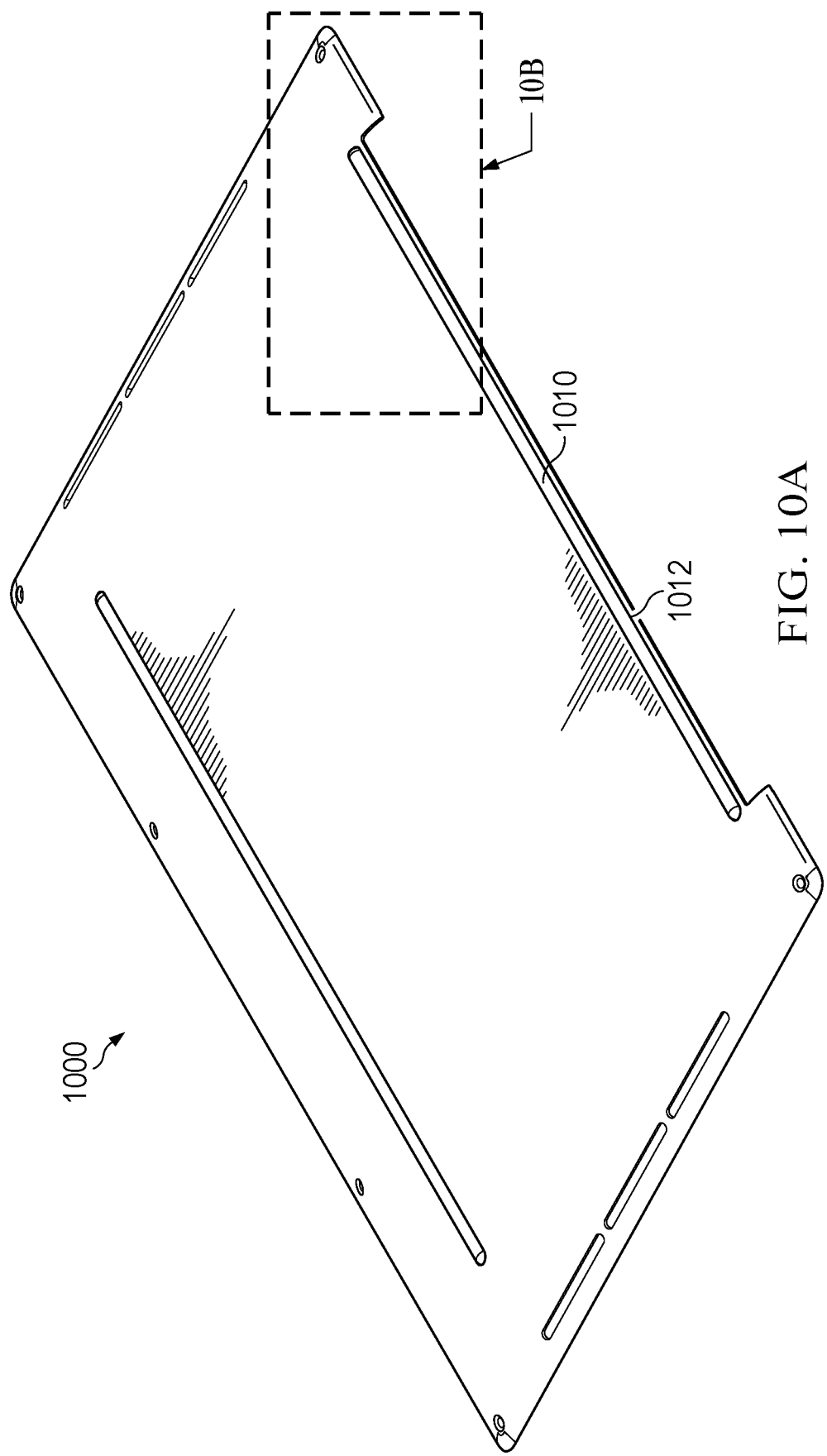
FIGS. 10A, 10B, 10C and 10D show a plurality of views of a D-cover of a portable information handling system.
Figure 10B:
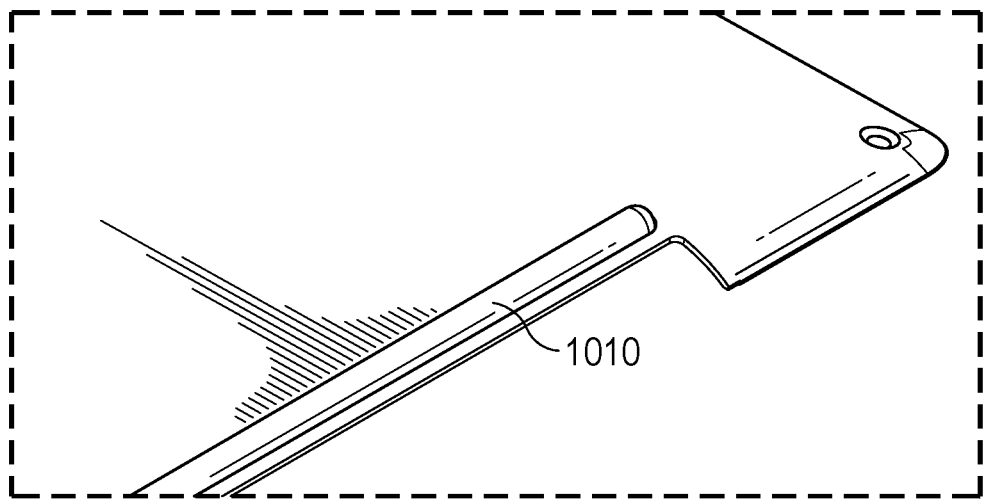
Figure 10C:
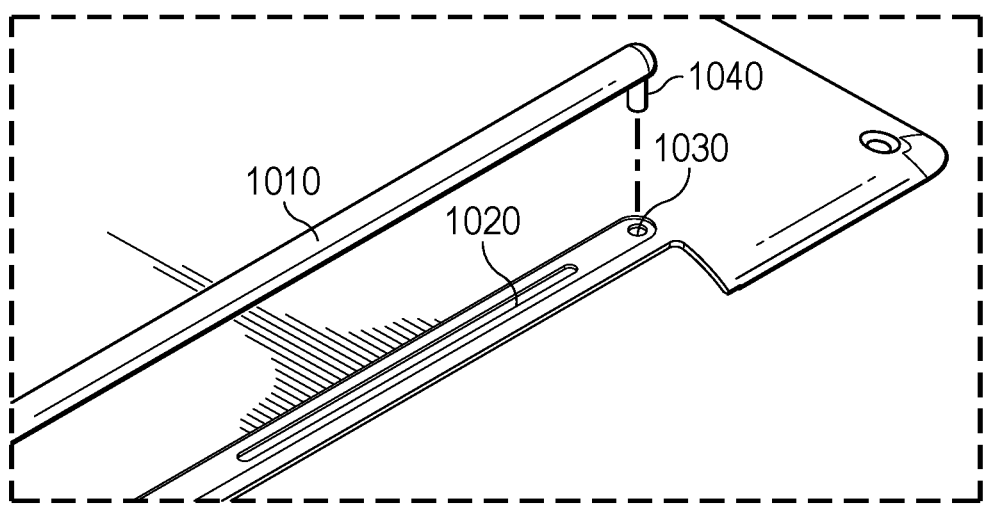
Figure 10D:
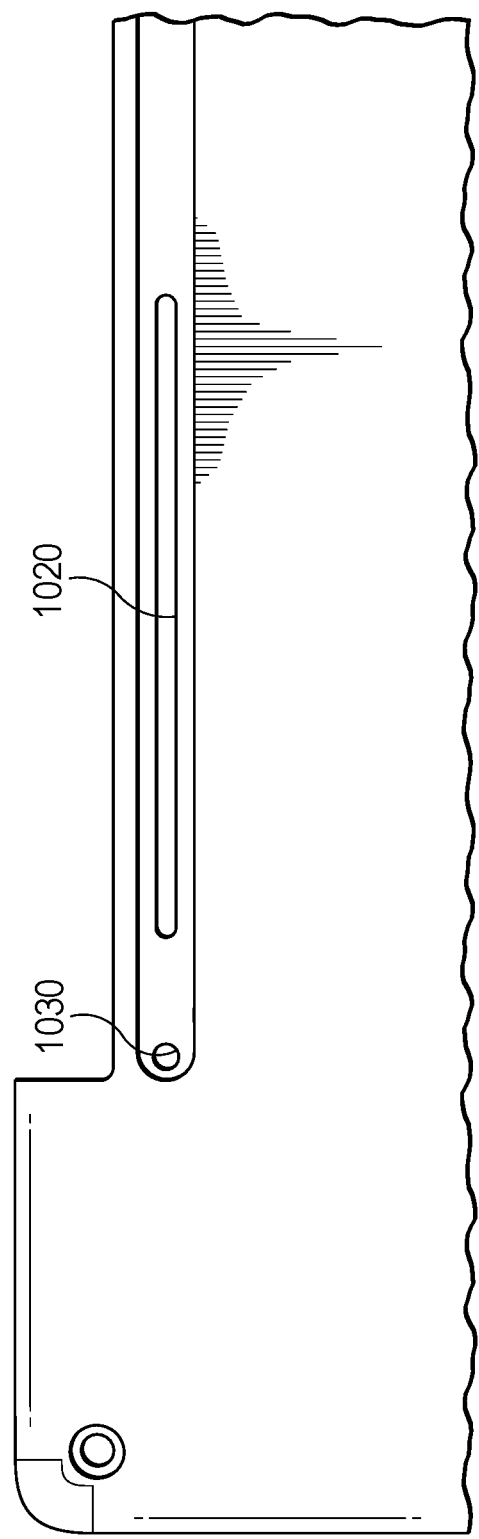

FIGS. 10A, 10B, 10C and 10D show a plurality of views of a D-cover 1000 of a portable information handling system. More specifically, FIG. 10A shows a bottom ISO view of the D-cover 1000. FIG. 10B shows an assembly view of a portion of the D-Cover 1000 with a slot of the D-Cover covered by a foot 1010. In certain embodiments, another slot (not shown) is positioned under another portion 1012 of the foot 1010. FIG. 10C shows an exploded view of a slot 1020 located under the foot 1010. In certain embodiments, the D-Cover 1000 defines one or more attachment apertures 1030. In certain embodiments, the foot 1010 includes one or more corresponding projections 1040 via which the foot 1010 is attached to the D-Cover 1000. FIG. 10D shows example slot dimensions of the slot 1020. In certain embodiments, the slot is substantially (e.g., +/−20%) 47.20 mm in the X direction. In certain embodiments, the slot is substantially (e.g., +/−20%) 1.50 mm in the Y direction.

Figure 11:
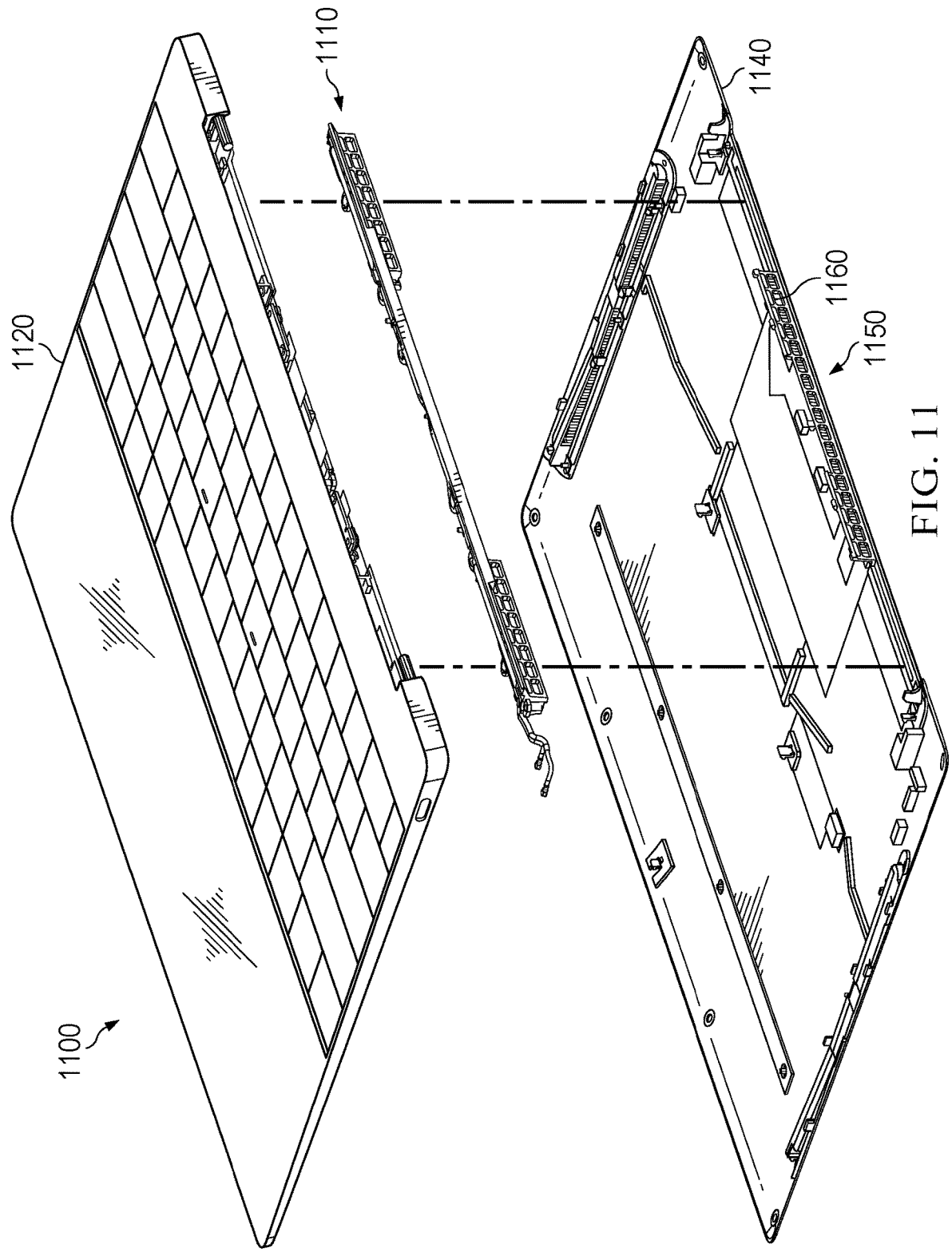
FIG. 11 shows an exploded perspective view of a base chassis of a portable information handling system.
Figure 12:
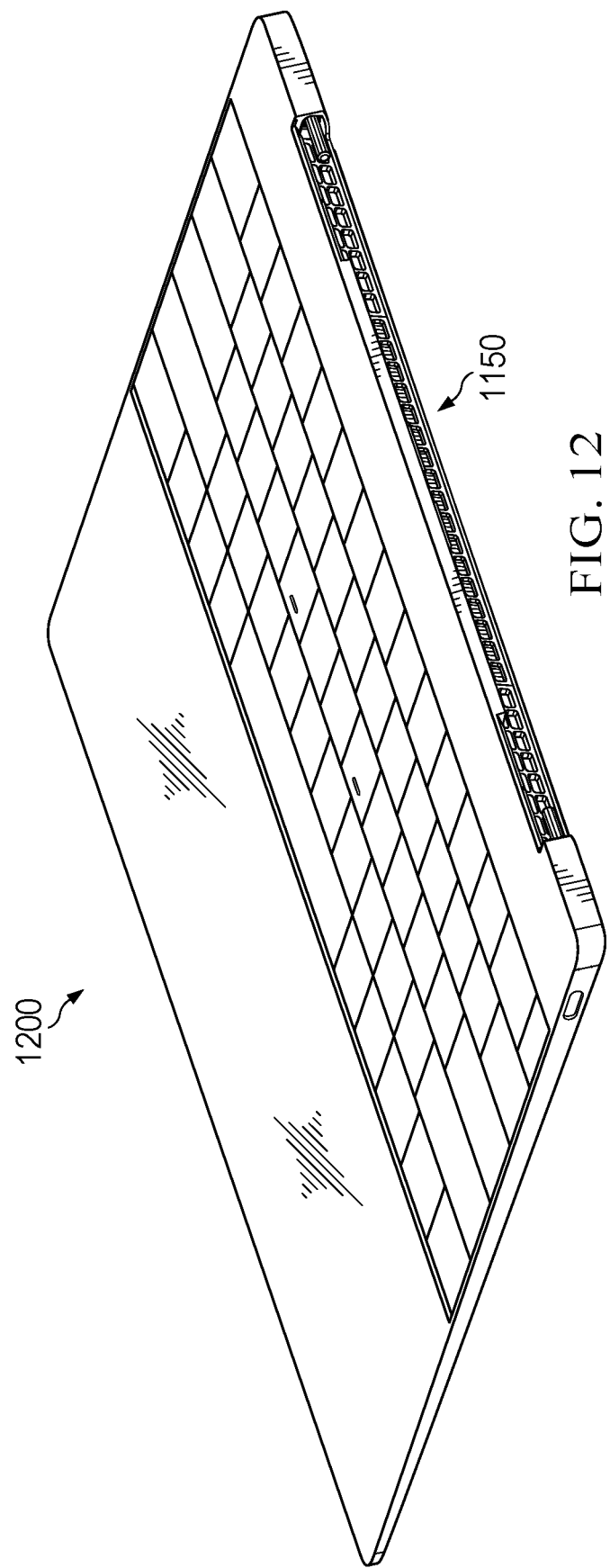
FIG. 12 shows a perspective view of a base chassis of a portable information handling system.

FIG. 11 shows an exploded perspective view of a base chassis 1100 of a portable information handling system. FIG. 12 shows a perspective view of an assembled base chassis 1200 of a portable information handling system. In certain embodiments, the antenna system 1110 is first attached to the C-Cover 1120. By attaching the antenna system 1110 to the C-Cover 1120, the antenna system 1110 can be easily attached to the motherboard (not shown) of the base chassis 1100. In certain embodiments, the D-Cover 1140 includes center venting to allow hinge up cabling to route before the D-Cover is installed. In certain embodiments, once the antenna system 1110 is attached to the motherboard 1130, the D-cover 1140 may be blindly attached with the C-Cover. In certain embodiments, the D-cover 1140 includes a center rear portion 1150. In certain embodiments, the center rear portion 1150 includes apertures 1160. In certain embodiments, the apertures 1160 are aligned with the apertures of the air flow portions of the antenna system. In certain embodiments, the apertures 1160 are horizontally aligned with the first set of apertures (e.g., apertures 830, 832) of the air flow portion 810.

Figure 13:
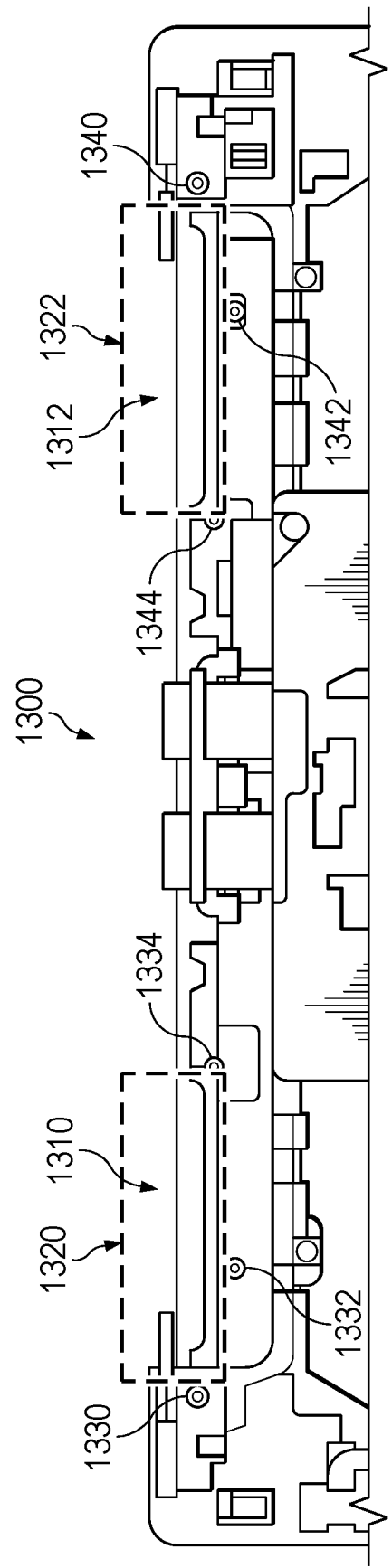
FIG. 13 shows a cut away top view of a portion of a base chassis of a portable information handling system.

FIG. 13 shows a cut away top view of a portion of a base chassis 1300 of a portable information handling system with the D-Cover removed. In certain embodiments, the antenna system 1300 includes ground isolation portions 1310, 1312 around each antenna envelope 1320, 1322 of the antenna system 1300. In certain embodiments, each antenna envelope is positioned around a respective antenna of the antenna system 1300. In certain embodiments, the ground isolation portion 1310, 1312 include respective gaskets which electrically couple the antenna carrier to an inner wall of the C-Cover. In certain embodiments, the ground isolation portions provide an antenna envelope in which there is no metal (or other RF obstructive material) above then antenna envelope.

In certain embodiments, the antenna system includes a plurality of fastener positions along each ground isolation portion 1310, 1312. In certain embodiments, the antenna system includes a corner fastener portion 1330, a mid fastener portion 1332 and a corner fastener 1334 positioned along the ground isolation portion 1310. In certain embodiments, the antenna system includes a corner fastener portion 1340, a mid fastener portion 1342 and a corner fastener 1344 positioned along the ground isolation portion 1312.

Figure 14:
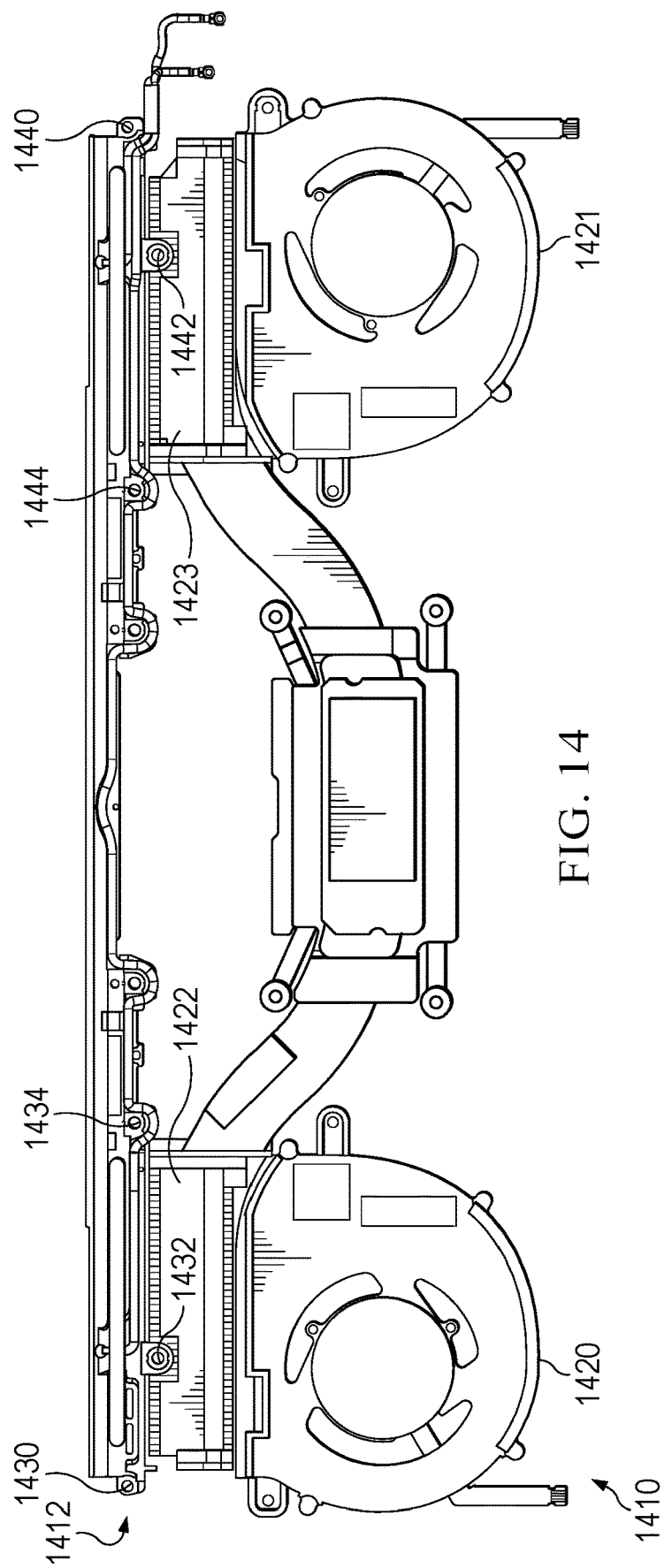
FIG. 14 shows a cut away top view of a thermal assembly and antenna carrier of a portable information handling system.
Figure 15:
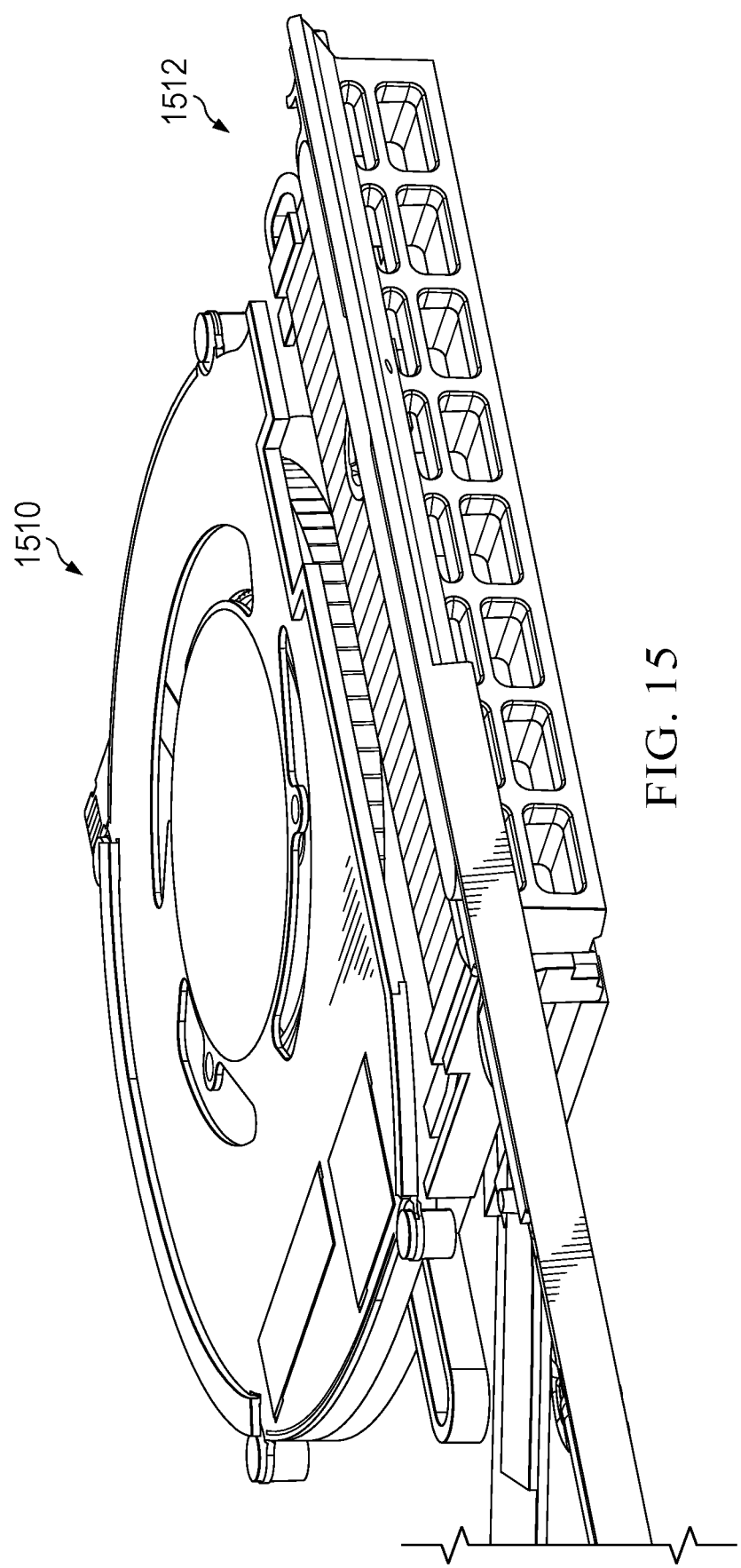
FIG. 15 shows a perspective view of a portion of a thermal assembly and a portion of an antenna carrier assembly for a portable information handling system.

FIG. 14 shows a top view of a thermal assembly 1410 and an antenna system 1412. FIG. 15 shows a perspective view of a portion 1510 of a thermal assembly and a portion 1512 of an antenna system for a portable information handling system.

In certain embodiments, the thermal assembly 1410 includes fan 1420 and a remote heat exchanger fin 1422. In certain embodiments, the thermal assembly 1410 includes fan 1421 and a remote heat exchanger fin 1423. In certain embodiments, the antenna system 1412 is positioned behind certain portions of the remote heat exchanger fin 1422. In certain embodiments, certain portions of the remote heat exchanger fin 1422 are contiguous with portion of the antenna system 1412. In certain embodiments, respective contiguous portions of the remote heat exchanger fin 1422 correspond to the positions of the fan 1420 and fan 1424. In certain embodiments, respective contiguous portions of the remote heat exchanger fin 1422 correspond to the positions of the radiating elements of the antenna system 1412. In certain embodiments, air flows from the fans 1420, 1421, across portions of the remote heat exchanger fins 1422, 1423, through the antenna system 1412 and out the rear of the portable information handling system.

In certain embodiments, the antenna system 1412 is mechanically and electrically coupled to the C-Cover via a corner fastener portion 1430, a mid fastener portion 1342 and a corner fastener 1344 position along a ground isolation portion (e.g., ground isolation portion 1310). In certain embodiments, antenna system 1412 is mechanically and electrically coupled to the C-Cover via a corner fastener portion 1440, a mid fastener portion 1442 and a corner fastener 1444 position along a ground isolation portion (e.g., ground isolation portion 1312).

Figure 16:
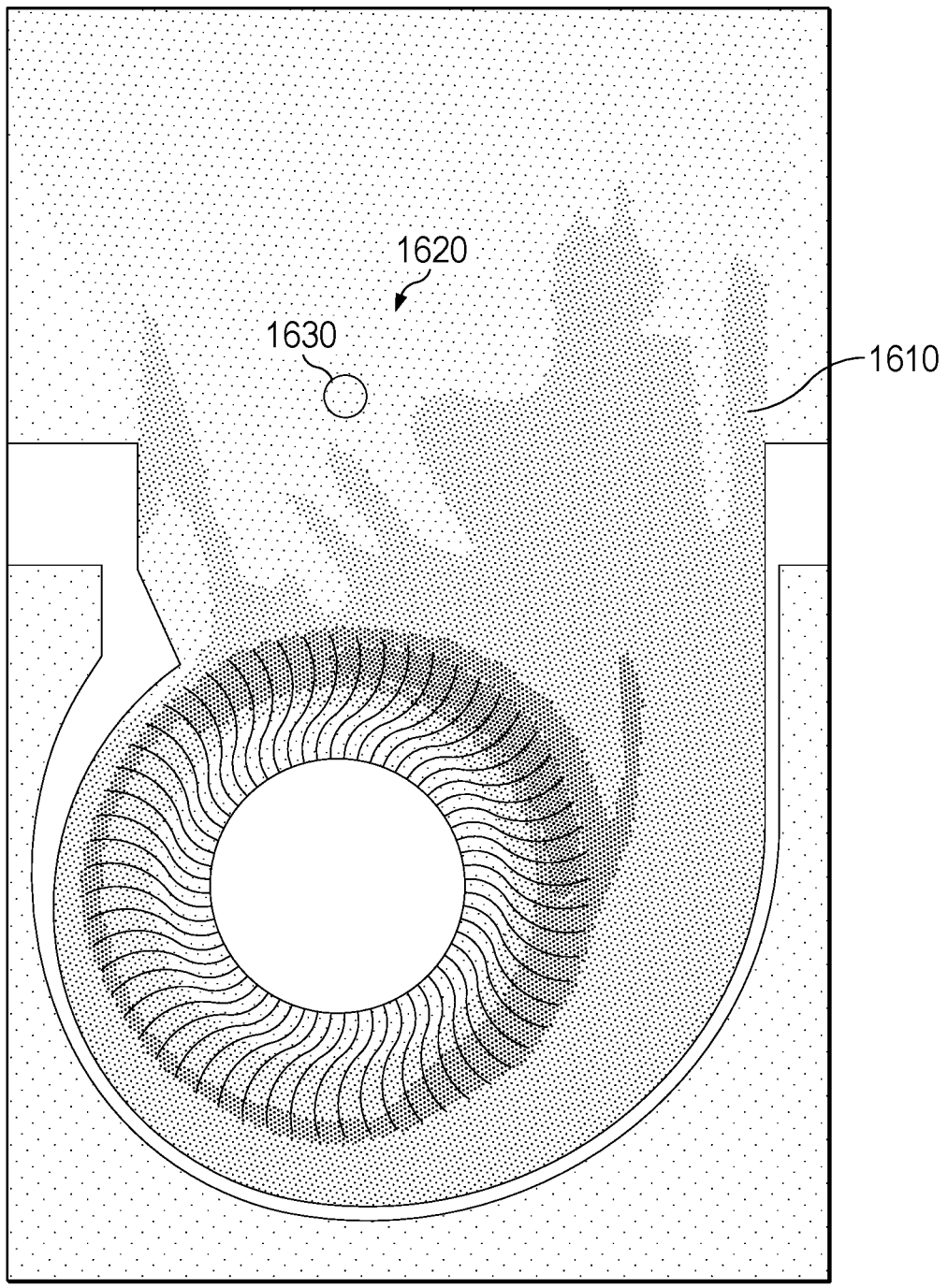
FIG. 16 shows a top view of example air flow across a portion of a thermal assembly and a portion of an antenna carrier assembly for a portable information handling system.

FIG. 16 shows a top view of example air flow across a portion of a thermal assembly and a portion of an antenna carrier assembly for a portable information handling system. The thermal assembly produces an air flow distribution which is higher in certain locations (see e.g., location 1610) and lower in other locations (see e.g., 1620) The mid fastener location 1630 is positioned to correspond to a lower air flow location. The positioning of the mid fastener location thus reduces air flow interference from the mid fastener portion.

Figure 17:
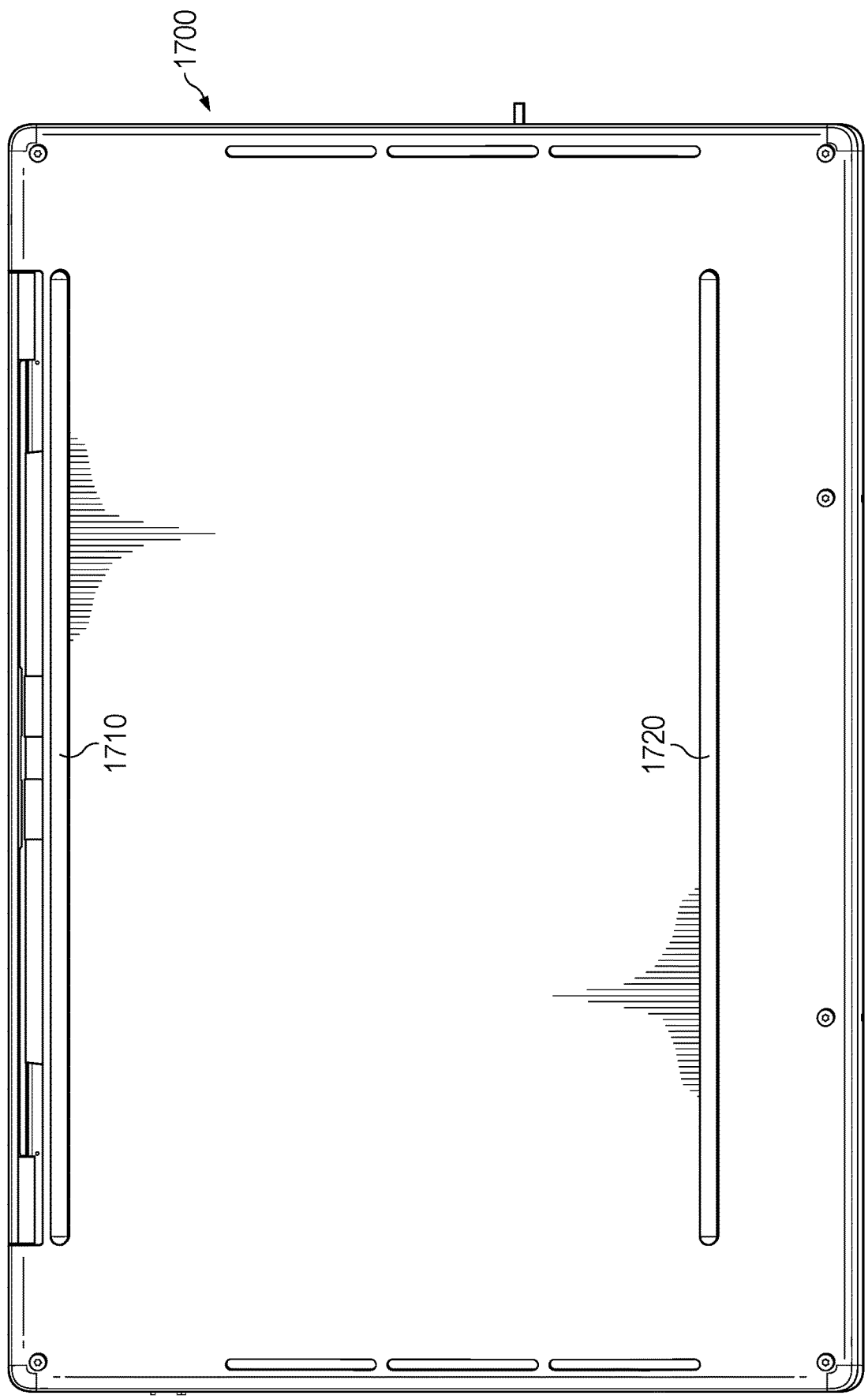
FIG. 17 shows a bottom view of a base chassis of a portable information handling system.

FIG. 17 shows a bottom view of a base chassis 1700 of a portable information handling system. In certain embodiments, by providing radiation slots that are positioned under the foot 1710 of the information handling system, the aesthetics of the base chassis are streamlined when compared to known information handling systems in which the radiation slots are visible. In certain embodiments, the radiation shots are positioned under the rear foot 1710 of the information handling system. In certain embodiments, the base chassis includes front foot 1720. In certain embodiments, the front foot 1720 is aesthetically similar to the rear foot 1710.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. An antenna system for a portable information handling system, comprising:
   an antenna radiating element; and,
   an antenna carrier assembly, the antenna radiating element being mounted to the antenna carrier assembly, the antenna carrier assembly comprising a first radiating slot and a second radiating slot, the first radiating slot providing a radiation path through a C-Cover of a base chassis of the portable information handling system in a lid open state of operation, the second radiating slot providing a radiation path through a D-cover of a base chassis of the portable information handling system in a lid closed state of operation; and wherein
   the antenna carrier assembly includes an air flow portion, the airflow portion functioning cooperatively with a thermal assembly to allow air flow out a rear portion of the base chassis of the portable information handling system.

2. The antenna system of claim 1, wherein:
   the second radiating slot is positioned under a foot of the base chassis of the portable information handling system.

3. The antenna system of claim 1, wherein:
   the airflow portion defines a plurality of apertures, the plurality of apertures being configured to facilitate air flow as well as RF radiation transmission.

4. The antenna system of claim 3, wherein:
   the dimensions of the plurality of apertures correspond to Lambda over eight of the high frequency of the antenna system.

5. The antenna system of claim 1, wherein:
   the air flow portion comprises a mesh wall, the mesh wall providing a noise isolation function.

6. An information handling system comprising:
   a processor;
   a data bus coupled to the processor; and
   an information handling system chassis housing, the chassis housing comprising a base chassis, the base chassis comprising an antenna system, the antenna system comprising
      an antenna radiating element; and,
      an antenna carrier assembly, the antenna radiating element being mounted to the antenna carrier assembly, the antenna carrier assembly comprising a first radiating slot and a second radiating slot, the first radiating slot providing a radiation path through a C-Cover of the base chassis of the portable information handling system in a lid open state of operation, the second radiating slot providing a radiation path through a D-cover of the base chassis of the portable information handling system in a lid closed state of operation; and wherein
   the antenna carrier assembly includes an air flow portion, the airflow portion functioning cooperatively with a thermal assembly to allow air flow out a rear portion of the base chassis of the portable information handling system.

7. The information handling system of claim 6, wherein:
   the second radiating slot is positioned under a foot of the base chassis of the portable information handling system.

8. The information handling system of claim 6, wherein:
   the airflow portion defines a plurality of apertures, the plurality of apertures being configured to facilitate air flow as well as RF radiation transmission.

9. The information handling system of claim 8, wherein:
   the dimensions of the plurality of apertures correspond to Lambda over eight of the high frequency of the antenna system.

10. The information handling system of claim 6, wherein:
    the air flow portion comprises a mesh wall, the mesh wall providing a noise isolation function.

* * * * *